United States Patent [19]

Mahmood

[11] Patent Number: 4,644,504

[45] Date of Patent: Feb. 17, 1987

[54] PROGRAMMABLE CMOS CIRCUIT FOR USER DEFINED CHIP ENABLE AND OUTPUT ENABLE

[75] Inventor: Qazi A. S. M. Mahmood, San Jose, Calif.

[73] Assignee: American Microsystems, Inc., Santa Clara, Calif.

[21] Appl. No.: 664,822

[22] Filed: Oct. 25, 1984

[51] Int. Cl.$^4$ ............................................. G11C 8/00
[52] U.S. Cl. ........................................ 365/230; 365/189
[58] Field of Search ............... 365/230, 189; 307/475

[56] References Cited

U.S. PATENT DOCUMENTS

4,408,305 10/1983 Kuo ..................................... 365/189

*Primary Examiner*—Joseph A. Popek
*Attorney, Agent, or Firm*—Steven F. Caserza; Alan H. MacPherson; Kenneth E. Leeds

[57] ABSTRACT

A circuit constructed in accordance with this invention is described which includes a programmable chip enable-output enable buffer (11-X). The chip enable-output enable buffer may be programmed to provide a chip enable function in response to a logical 1 or logical 0 chip enable input signal, an output enable function in response to a logical 1 or logical 0 output enable input signal, or an active powered chip regardless of the provided input signal. The chip enable-output enable buffer is programmed by "programming" selected transistors in the buffer. A P channel transistor (40, 60) is programmed by causing its source to be connected to its drain. An N channel transistor (50, 60) is programmed by causing its source and drain to be disconnected. In one embodiment, the programming is accomplished in the preferred embodiment by either a diffusion process or an ion implantation process.

6 Claims, 17 Drawing Figures

Implantation Area

PROGRAMMABLE CMOS CIRCUIT FOR USER DEFINED CHIP ENABLE AND OUTPUT ENABLE

BACKGROUND OF THE INVENTION

This invention relates to data output control of circuitry connected to a common data bus.

Memory circuitry is designed to provide specific data words on the output terminals of the memory circuit in response to address signals. Generally these data words are placed on a data bus which is connected to several other devices. In most applications memory circuits do not provide continuous streams of data words, but rather provide data words on command from external circuitry. Usually, data is communicated from one component connected to the data bus to another component connected to the data bus and components not involved in a particular communication must not affect the data being communicated by the data bus. Therefore, most memory circuits are designed so that the memory circuit is effectively "disconnected" from the data bus when data is not required from the memory circuit.

Many memory circuits are provided with "chip enable" and/or "output enable" input terminals which receive a signal which enables or disables the memory circuit. A chip enable input lead controls the power to the circuits in the memory device. When a chip enable signal is received, all circuits in the memory device are fully powered. When a chip enable signal is not received, power is removed from selected portions of the memory device. On the other hand, an output enable signal causes the output buffers of the memory circuit to provide a high impedance output when an output enable signal is not received, that is the output terminals of the output buffer can neither source nor sink current and thus have no effect on the data bus to which they are connected. When an output enable signal is received on the output enable input terminal of a memory circuit, the output buffers of the memory circuit provide logical 1 (approximately two volts or higher) or logical 0 (approximately 0.8 V or lower) output signals corresponding with the data word in the memory matrix selected by the address input signals.

Whether a circuit designer prefers a memory circuit having a chip enable function or an output enable function is a trade-off. During periods when a memory circuit with a chip enable function does not receive a chip enable signal, the memory circuit draws very little power. However, when the memory circuit is required to provide a data word, it takes a certain period of time to power up the circuit to provide the addressed data word. On the other hand, a memory circuit with an output enable function is continuously drawing power, thus requiring more power than a memory circuit with a chip enable function. However, because a memory circuit with an output enable function is continuously powered, it does not require any time to power up the circuit before the circuit can provide output data. In summary, a memory circuit with a chip enable function requires less power than a memory circuit with an output enable function; a memory circuit with an output enable function is faster than a memory circuit with a chip enable function.

Figure 1:
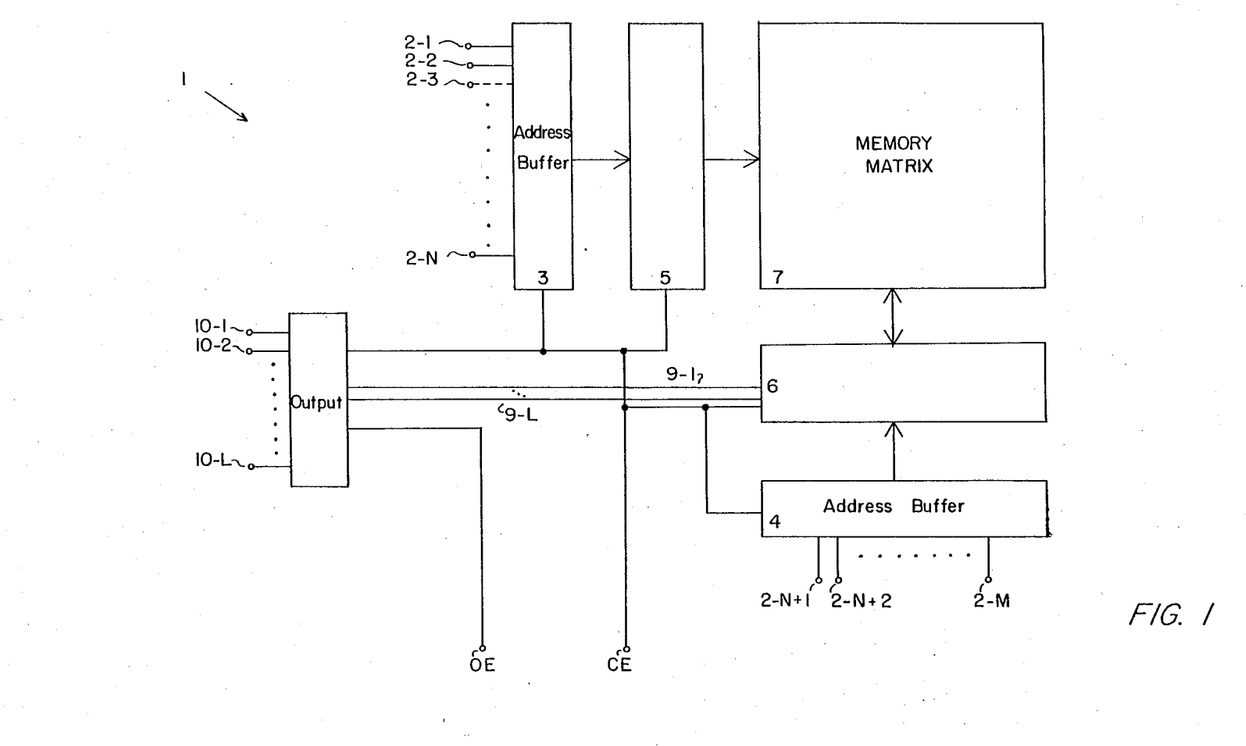
FIG. 1 is a block diagram of a prior art ROM circuit providing both output enable and chip enable functions.

A block diagram of a circuit which provides both output enable and chip enable functions is shown in FIG. 1. Circuit 1 is capable of providing a chip enable function by providing an appropriate signal on input terminal CE, for applications where speed is not an important factor. Circuit 1 also provides an output enable function by providing an appropriate signal on input terminal OE for applications where power consumption is not a major design factor or circuits where there are periods of operation where high speed is necessary.

However, circuit 1 requires external circuitry to determine when a chip enable or output enable signal should be provided. Therefore, it is desirable to provide circuitry which will accept chip enable or output enable signals from each of the various components which may require data to be provided by the memory circuit. In addition, it is desirable to provide a circuit which may be programmed to define whether each of the enable input pins in a multiple enable input pin configuration provide a chip enable or output enable function. In addition, it is desirable to be capable of programming what type of input signal (logical 1 or logical 0) constitutes a chip enable or output enable signal.

A programmable chip enable-output enable circuit is provided in AMI part no. 9452. This circuit is an N-channel metal oxide semiconductor circuit (NMOS). NMOS technology has a relatively high power consumption compared to complementary metal oxide semiconductor (CMOS) technology. Thus, it is desirable to provide a programmable chip enable-output enable circuit using CMOS technology.

SUMMARY

A circuit constructed in accordance with this invention includes a programmable chip enable-output enable buffer. The chip enable-output enable buffer is selectively programmed to provide a chip enable function in response to either a logical 1 or logical 0 chip enable input signal, an output enable function in response to either a logical 1 or logical 0 output enable input signal, or an active powered chip regardless of the provided input signal.

The chip enable-output enable buffer is programmed by altering selected transistors in the buffer. A P channel transistor is altered by causing its source and drain to be connected or shorted. An N channel transistor is altered by causing its source and drain to be disconnected or open. In one embodiment, the altering of the selected transistors is accomplished by either a diffusion process or an ion implantation process.

DETAILED DESCRIPTION

Figure 2:
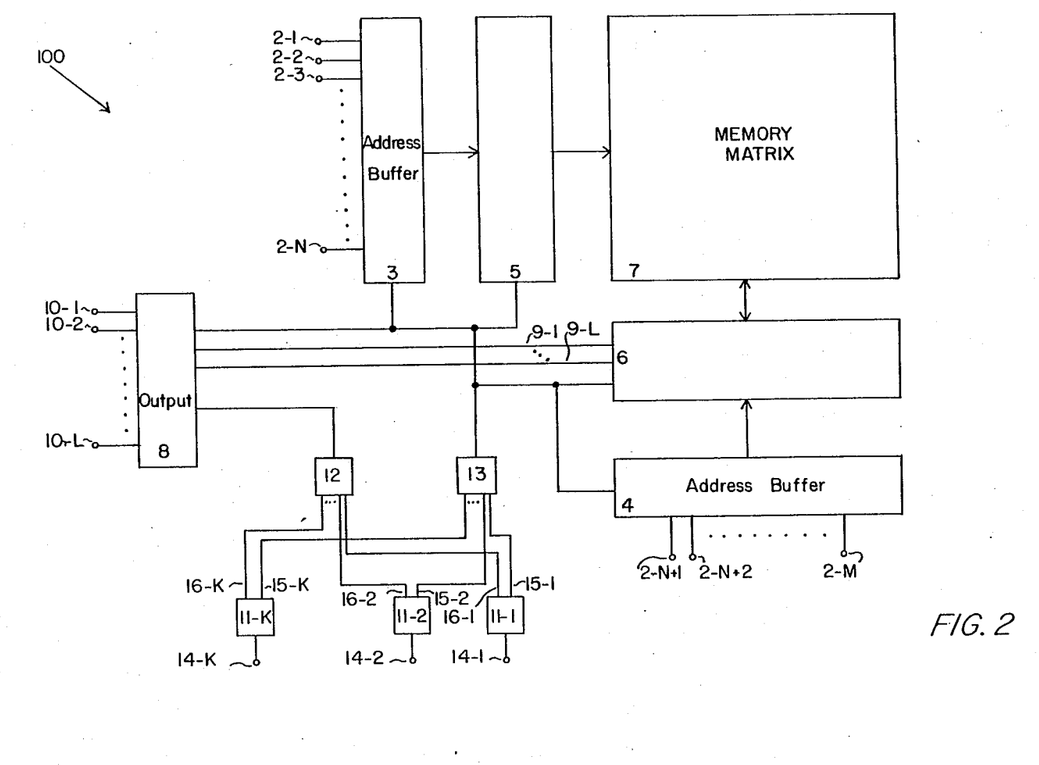
FIG. 2 is a block diagram of one embodiment of the present invention which includes multiple enable input pins and programmable definition of the operation of the enable input buffers.

An example of a circuit constructed in accordance with the present invention is ROM 100 in FIG. 2. A particular data word is provided on output leads 10-1 through 10-L, where L is a positive integer, of ROM 100 in response to address input signals provided on input leads 2-1 through 2-N, where N is a positive integer, and 2-N+1 to 2-M, where M is a positive integer greater than N. The address signals provided on address input leads 2-1 through 2-M are received by address buffers 3 and 4 and decoded by decoder 5 and decoder 6. The selected data word is transmitted to output buffer 8 by data leads 9-1 through 9-L. The data word is provided by output buffer 8 on data output leads 10-1 through 10-L.

ROM 100 is enabled and disabled by output enable combinational logic circuit 12 and chip enable combinational logic circuit 13 in response to enable input signals provided on input leads 14-1 through 14-K, where K is a positive integer. Combinational logic circuits 12 and 13 are, in one embodiment, either NAND or NOR gates, depending on the polarity of the available input signals to be applied to input leads 15-1 through 15-K and 16-1 through 16-K, respectively, and on the desired polarity of the output signals of combinational logic circuits 12 and 13. As an example, if a logical 0 output signal is required from combinational logic circuits 12 and 13 for chip enable and output enable, respectively, and when the input signals applied to input leads 15-1 through 15-K and 16-1 through 16-K are all logical 1, then combinational logic circuits 12 and 13 can be formed using NAND gates. Naturally, any combination of gates can be provided in order to provide chip enable and output enable signals of proper polarity in response to available input signals. When output enable logic circuit 12 provides a logical 1 output signal in response to signals provided on leads 16-1 through 16-K, output buffer 8 provides a high impedance output signal on output leads 10-1 through 10-L. When output enable logic circuit 12 provides a logical 0 output signal in response to signals provided on leads 16-1 through 16-K, output buffer 8 provides logical 1 and logical 0 output signals on output leads 10-1 through 10-L in response to the data word received on data leads 9-1 through 9-L. When chip enable logic circuit 13 provides a logical 1 output signal in response to signals provided on leads 15-1 through 15-K, address buffers 3 and 4, decoder 5, multiplexer 6, and output buffer 8 are powered down. When chip enable logic circuit 13 provides a logical 0 output signal in response to signals provided on leads 15-1 through 15-K, address buffers 3 and 4, decoder 5, multiplexer 6, and output buffer 8 are powered up.

Figure 3:
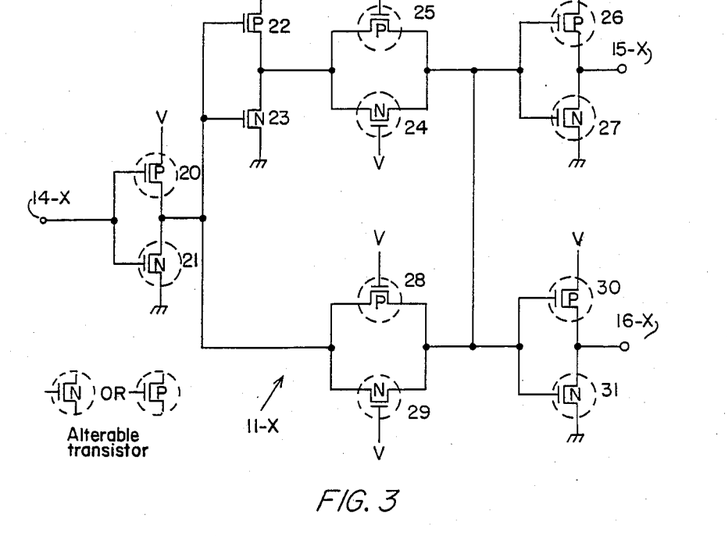
FIG. 3 is a schematic diagram of one embodiment of circuits 11-1 through 11-K of FIG. 2.

The signals provided on leads 15-1 through 15-K and leads 16-1 through 16-K are determined by enable input buffers 11-1 through 11-K and input signals provided on input terminals 14-1 through 14-K. An example of one of enable input buffers 11-1 through 11-K is shown in FIG. 3. Transistors 20, 21, 24, 25, 26, 27, 28, 29, 30, and 31 are "alterable" transistors. When a P channel transistor is altered, the source and drain of the programmed P channel transistor are effectively connected or shorted. When a P channel transistor is unaltered it operates as a normal P channel transistor. When an N channel transistor is altered, the source and the drain of the altered N channel transistor are disconnected, that is, there is always an open circuit between the source and drain of the altered N channel transistor. When an N channel transistor is unaltered, it operates as a normal N channel transistor.

Figure 4A:
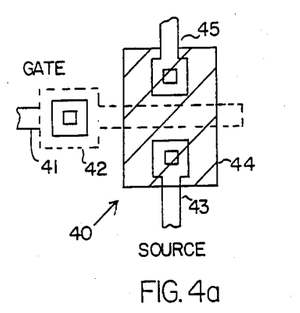
FIG. 4a is a plan view of an unaltered P channel field effect transistor.
Figure 4B:
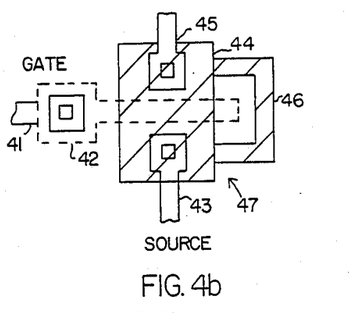
FIG. 4b is a plan view of a programmed P channel field effect transistor which is programmed by diffusion processes.

An alterable transistor may be altered during the diffusion step which forms the channels of the programmable transistors or at a later stage by implanting boron ions into the channel regions underlying the gate of the transistors. In one embodiment of this invention, alterable P channel transistors are altered by the implantation of dopants using the same masking and implantation step which is used to program N channel transistor memory cells contained in a read-only memory (not shown) contained on the same integrated circuit device. Transistor 40 in FIG. 4a is a P channel transistor which is unaltered but which may be altered using the diffusion method. Metal contact 41 and polycrystalline silicon gate 42 form the gate of P channel transistor 40. Channel 44 is contacted at either end by drain contact 45 and source contact 43. Transistor 40 operates as a normal P channel MOS transistor. Transistor 47 of FIG. 4b is an altered P channel transistor which has been altered using the diffusion step method. Diffusion interconnect 46 is a highly doped P-type region, which serves as an electrical conductor between source contact 43 and drain contact 45.

Figure 5A:
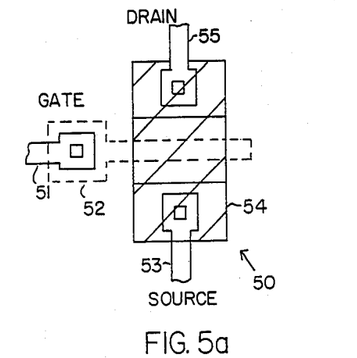
FIG. 5a is a plan view of an unprogrammed N channel field effect transistor.
Figure 5B:
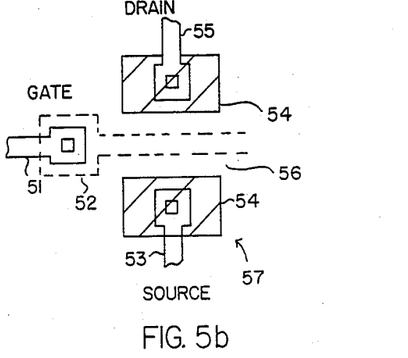
FIG. 5b is a plan view of a programmed N channel field effect transistor which is programmed using diffusion processes.

Transistor 50 in FIG. 5a is an N channel transistor which is unaltered but which may be altered using the diffusion method. Gate contact 51 and polycrystalline silicon gate 52 form the gate of transistor 50. Channel 54 is contacted at either end by source contact 53 and drain contact 55. Transistor 50 operates as a normal N channel MOS transistor. N channel transistor 57 in FIG. 5b is an N channel transistor which has been altered using the diffusion programming method. Region 56 of channel 54 is not formed during the diffusion step which creates N channel 54. Therefore, even when a biasing voltage is applied to gate lead 51 transistor 57, is open between source 53 and drain 55.

Figure 6A:
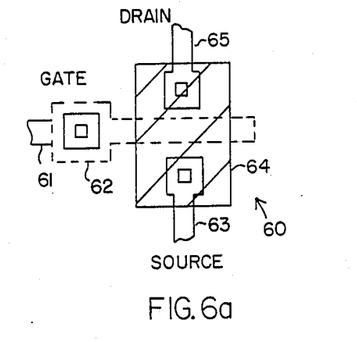
FIG. 6a is a plan view of an unprogrammed P or N channel field effect transistor.
Figure 6B:
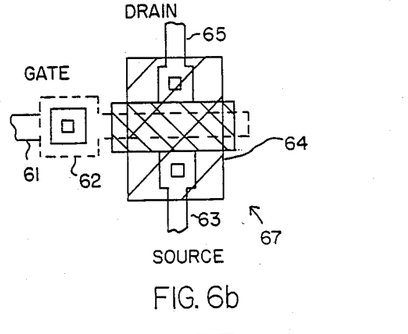
FIG. 6b is a plan view of a field effect transistor indicating the region of boron implantation which programs either an N or P channel field effect transistor using implantation processes.

FIG. 6a is a plan view of an unaltered N or P channel transistor which is altered using the ion implantation method. Transistor 60 has gate contact 61, polycrystalline silicon gate 62, source contact 63, channel region 64, and drain contact 65. Transistor 60 operates as a normal N or P channel MOS transistor depending on the doping of channel region 64. To alter a transistor using the ion implantation method, an area coincidental with polycrystalline silicon gate 62 and channel region 64 is opened in a protective oxide layer (not shown) formed on top of transistor 60 above channel 64. High energy boron ions are used which are capable of penetrating through polycrystalline silicon gate 62 and the gate dielectric, thereby being implanted into channel region 64 located beneath polycrystalline silicon gate 62. When transistor 67 is a P channel transistor, the boron ion implantation lowers the gate to source threshold voltage to a level sufficient to cause transistor 67 to be on for all voltages between 0 and the positive voltage source V applied to transistors 20, 28, 25, 26, and 30 in FIG. 3. When transistor 67 is an N channel transistor, the boron ion implantation raises the gate to source threshold voltage of transistor 67 to a level so that transistor 67 is always off for all of the voltages applied to the gates of transistors 21, 24, 27, 29, and 31 in FIG. 3.

Table 1 indicates which transistors are altered for circuit 11-X to provide either a chip enable active high (i.e., the chip is enabled when a logical 1 CE input signal is received on input pin 14-X), chip enable active low (i.e., the chip is enabled when a logical 0 $\overline{CE}$ is received on input pin 14-X), output enable active high (i.e., the output buffer is enabled when a logical 1 OE input signal is received on input pin 14-X), output enable active low (i.e., the output buffer of memory circuit 1 is enabled when a logical 0 $\overline{OE}$ input signal is received on input pin 14-X), or active no connect (i.e., the chip is enabled regardless of the input signal received on input lead 14-X) function. The output enable function is sometimes called the "chip select" function as is indicated in Table 1. For each of the five possible functions of input buffer 14-X a specific group of transistors must be altered as indicated by a check mark in the box corresponding to that transistor. Those transistors with an "x" in their box are not altered.

Figure 7:
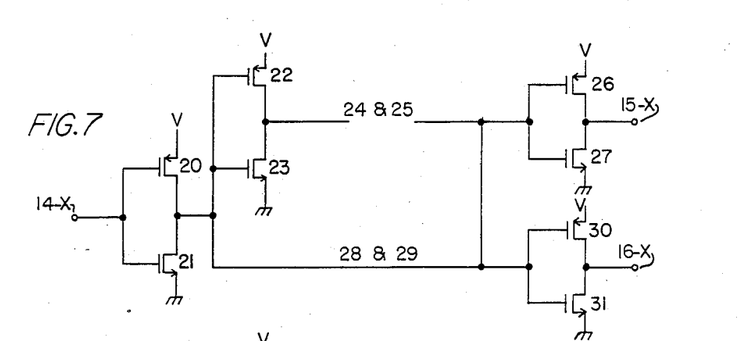
FIGS. 7-11 are schematic diagrams illustrating the operation of chip enable-output enable buffers 11-1 through 11-K in circuit 100 of FIG. 2.

FIG. 7 is a schematic diagram of enable buffer 11-X when enable buffer 11-X is altered to provide the chip enable active high function. Transistor 24 and transistor 28 are altered. The gate of transistor 25 is connected to positive voltage source V, thus transistor 25 is off. Transistor 24 is programmed to provide an open circuit. Therefore, transistors 24 and 25 are an open circuit as shown in FIG. 7. Transistor 28 is programmed to provide a short circuit. The gate of transistor 29 is connected to positive voltage source V, thus transistor 29 is on. Therefore, transistors 28 and 29 function as a short circuit as shown in FIG. 7. A logical 1 input signal on input pin 14-X is inverted once by transistors 20 and 21 and inverted again by transistors 26 and 27 to provide a logical 1 output on output lead 15-X. The output signal from transistors 20 and 21 is inverted by transistors 30 and 31 to provide a logical 1 output on output lead 16-X. Conversely, when a logical 0 input signal is received on input pin 14-X, the input signal is inverted once by transistors 20 and 21, and once again by transistors 26 and 27 and by transistors 30 and 31. Therefore, input buffer 11-X provides a logical 0 on output leads 15-X and 16-X.

Figure 8:
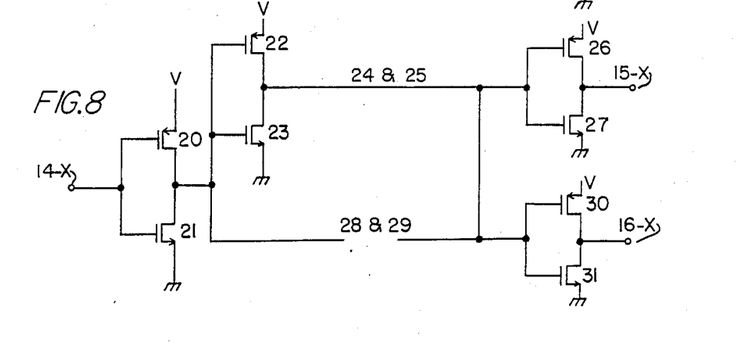

FIG. 8 is a schematic diagram of enable buffer 11-X when enable buffer 11-X is programmed to provide the chip enable active low function. When a logical 1 input signal is received on input lead 14-X, it is inverted once by transistors 20 and 21, once again by transistors 22 and 23 and a third time by transistors 26 and 27 and by transistors 30 and 31. Thus, enable buffer 11-X provides a logical 0 output signal on output leads 15-X and 16-X. Conversely, when a logical 0 input signal is received on input lead 14-X, it is inverted once by transistors 20 and 21, once again by transistors 22 and 23, and a third time by transistors 26 and 27 and by transistors 30 and 31, thus providing a logical 1 output signal on leads 15-X and 16-X.

Figure 9:
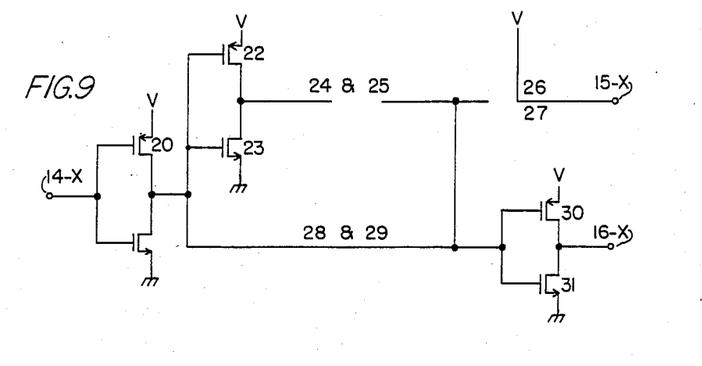

FIG. 9 is a schematic diagram of enable buffer 11-X when enable buffer 11-X is programmed to provide the output enable active high function. Output lead 15-X is connected to positive voltage supply V through altered P channel transistor 26 and is disconnected from ground by altered N channel transistor 27. Thus, output lead 15-X provides a logical 1 output signal regardless of the input signal on input lead 14-X. A logical 1 input signal on input lead 14-X is inverted once by transistors 20 and 21 and is inverted again by transistors 30 and 31 to provide a logical 1 output signal on output lead 16-X. Conversely, when a logical 0 input signal is received on input lead 14-X, it is inverted once by transistors 20 and 21 and once again by transistors 30 and 31 to provide a logical 0 output signal on output lead 16-X.

Figure 10:
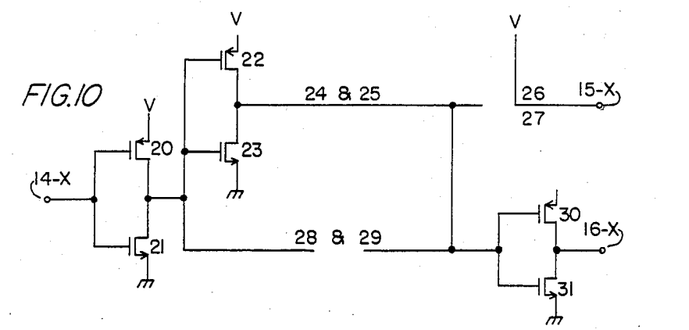

FIG. 10 is a schematic diagram of output buffer 11-X when output buffer 11-X is programmed to provide the output enable active low function. Output lead 15-X is connected to positive voltage source V through altered P channel transistor 26. Thus, output lead 15-X is a logical 1 regardless of the input signal or input lead 14-X. A logical 1 input signal on input lead 14-X is inverted once by transistors 20 and 21, inverted once again by transistors 22 and 23 and inverted a third time by transistors 30 and 31 to provide a logical 0 output signal on output lead 16-X. A logical 0 input signal on input lead 14-X is inverted once by transistors 20 and 21, once again by transistors 22 and 23 and a third time by transistors 30 and 31 to provide a logical 1 output signal on output lead 16-X.

Figure 11:
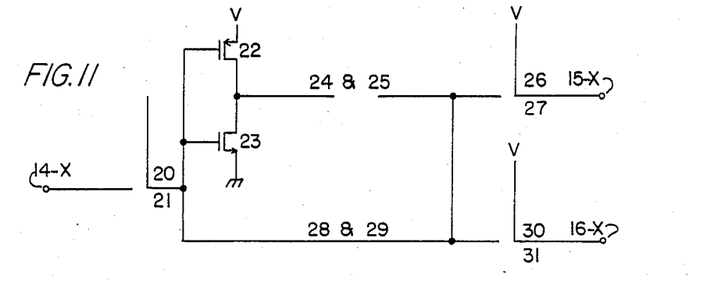

FIG. 11 is a schematic diagram of enable buffer 11-X when enable buffer 11-X is programmed to provide the active no connect function. In this mode it is desired that ROM 100 is to remain enabled regardless of the input signals received on lead 14-X. Accordingly, in this mode output lead 15-X is tied to positive voltage source V through altered P channel transistor 26 and output lead 16-X is connected to positive voltage source V through altered P channel transistor 30. Therefore, output leads 15-X and 16-X provide logical 1 output signals regardless of the input signals received on input lead 14-X. Transistors 20 and 21 are programmed so that the power drawn by transistors 20, 21, 22, and 23 is minimized. CMOS circuitry draws significant amounts of power only when it is in a transition from a logical 1 to a logical 0 or vice versa. Furthermore, transistors 20, 21, 22, and 23 can draw power if the input signals to transistor 20 and 21 are at TTL levels, or any level other than 0 volts or positive voltage source V. Therefore, by connecting the gates of transistors 22 and 23 to positive voltage source V through programmed transistor 20, transisitors 22 and 23 provide a logical 0 output signal and therefore draw no current.

Figure 12:
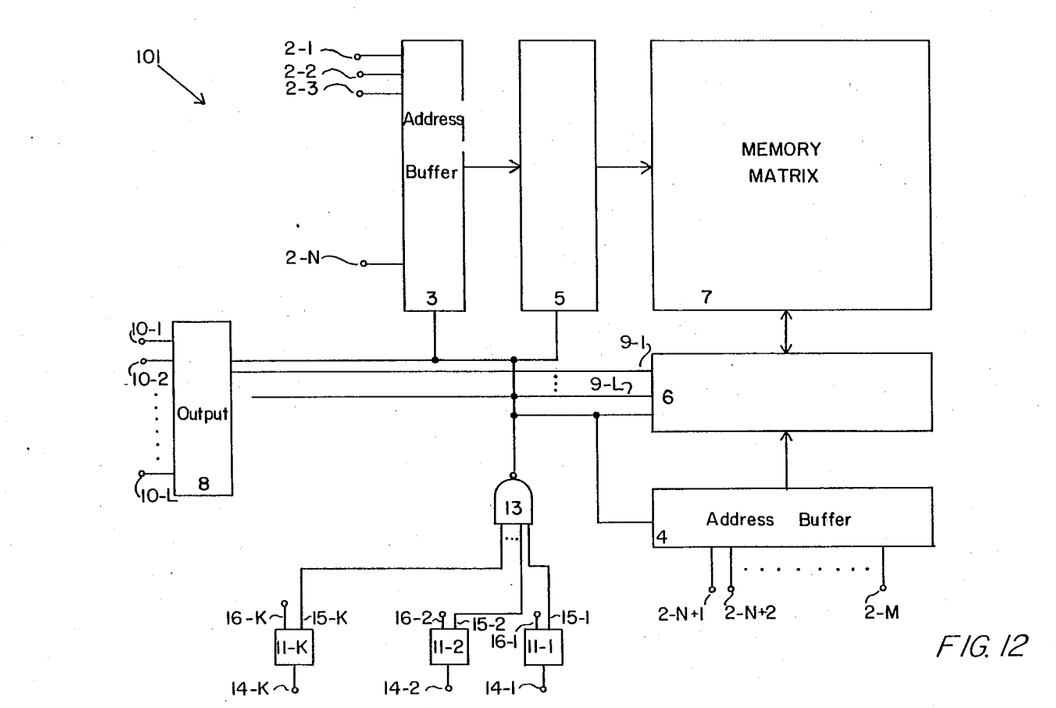
FIG. 12 is a block diagram of one embodiment of a ROM constructed in accordance with the teachings of the present invention where circuit 101 includes only a chip enable function.
Figure 13:
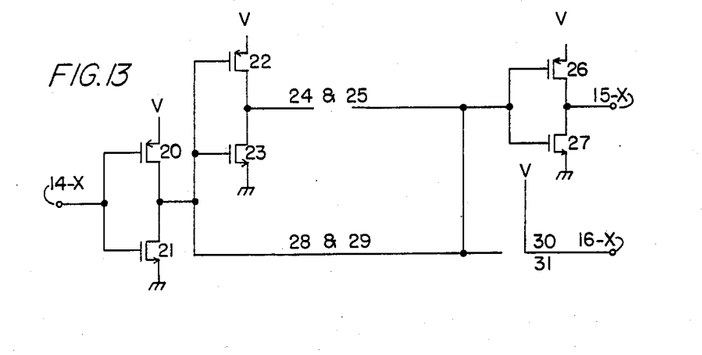
FIGS. 13 and 14 are schematic diagrams illustrating the operation of chip enable-output enable buffers 11-1 through 11-K in circuit 101 of FIG. 12.

Table 2 describes two programming modes for enable buffer 11-X which are designed for a memory circuit such as ROM 101 in FIG. 12 which does not include an output enable function. Components in ROM 101 in FIG. 12 which are labeled similarly to components in ROM 100 of FIG. 2 perform the same function as the corresponding component in ROM 100. FIG. 13 is a functional diagram of enable buffer 11-X in FIG. 12 when enable buffer 11-X is programmed to provide the chip enable active high function of Table 2. Output lead 16-X is connected to positive voltage source V to save the power which would be necessary during the transitions from logical 0 to logical 1 and vice versa of transistors 30 and 31. A logical 1 input signal on input lead 14 is inverted once by transistors 20 and 21 and a second time by transistors 26 and 27 to provide a logical 1 output signal on output lead 15-X. Conversely, a logical 0 input signal on input lead 14-X is inverted once by transistors 20 and 21 and once again by transistors 26 and 27 to provide a logical 0 output signal on output lead 15-X.

Figure 14:
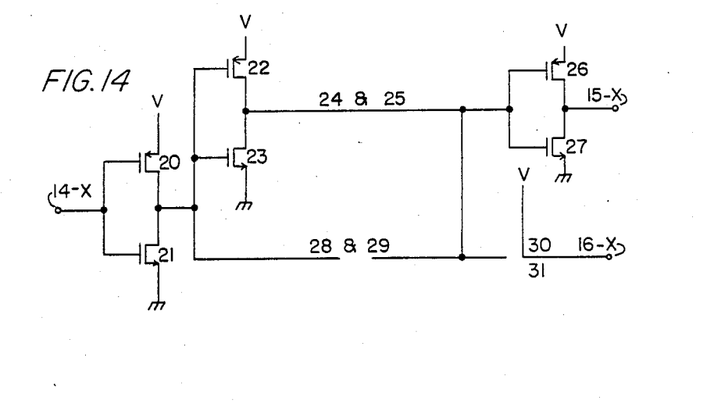

FIG. 14 is a schematic diagram of enable buffer 11-X when enable buffer 11-X is programmed to provide the chip enable active low function of Table 2. A logical 1 input signal on input lead 14-X is inverted once by transistors 20 and 21, once again by transistors 22 and 23, and a third time by transistors 26 and 27 to provide a logical 0 output signal on output lead 15-X. Conversely, a logical 0 input signal on input lead 14-X is inverted once by transistors 20 and 21, once again by transistors 22 and 23, and a third time by transistors 26 and 27 to provide a logical 1 output signal on output lead 15-X.

As described above, in accordance with the teachings of this invention, a circuit is provided which is capable of being programmed to provide either chip enable active high, chip enable active low, or active no connect functions. Thus the circuit constructed in accordance with the teachings of this invention is capable of controlling additional circuitry and is customized as desired to provide a selected control function.

While this specification illustrates the specific embodiments of this invention, it is not to be interpreted as limiting the scope of the invention. Many embodiments of this invention will become evident to those of ordinary skill in the art in light of the teachings of this specification.

TABLE 1

| Buffer Function | Transistor Programmed | | | | | | | | | |
|---|---|---|---|---|---|---|---|---|---|---|
| | 20 | 21 | 25 | 24 | 28 | 29 | 26 | 27 | 30 | 31 |
| CE Active High | X | X | X | ✓ | ✓ | X | X | X | X | X |
| CE Active Low | X | X | ✓ | X | X | ✓ | X | X | X | X |
| OE (or CS) Active High | X | X | X | ✓ | ✓ | X | ✓ | ✓ | X | X |
| OE (or CS) Active Low | X | X | ✓ | X | X | ✓ | ✓ | ✓ | X | X |
| Active No Connect | ✓ | ✓ | X | ✓ | ✓ | X | ✓ | ✓ | ✓ | ✓ |

CE = Chip Enable,
CS = Chip Select and
OE = Output Enable

TABLE 2

Device which only has Chip Enable, But no Output Enable.

| Buffer Function | Transistor Programmed | | | | | | | | | |
|---|---|---|---|---|---|---|---|---|---|---|
| | 20 | 21 | 25 | 24 | 28 | 29 | 26 | 27 | 30 | 31 |
| CE Active High | X | X | X | ✓ | ✓ | X | X | X | ✓ | ✓ |
| CE Active Low | X | X | ✓ | X | X | ✓ | X | X | ✓ | ✓ |

✓ - Transistor altered.
X - Transistor not altered.

What is claimed:

1. A programmable enable buffer having an input terminal for receiving an input enable signal, a first output terminal for providing a chip enable output signal, and a second output terminal for providing an output enable output signal, comprising:
   an input enable lead connected to said input terminal for receiving an input enable signal;
   programming means for selectively providing a plurality of programmed output states of a chip enable output signal to said first output terminal or of an output enable output signal to said second output terminal in response to said input enable signal;
   a chip enable lead connected to said first output terminal for carrying said chip enable output signal;
   an output enable lead connected to said second output terminal for carrying said output enable output signal.

2. A programmable enable buffer as in claim 1 wherein said plurality of programmed states comprise one or more states selected from the group of states consisting of:
   (a) chip enable active high, wherein said chip enable signal is provided when said enable signal is high;
   (b) chip enable active low, wherein said chip enable signal is provided when said enable signal is low;
   (c) output enable active high, wherein said output enable signal is provided when said enable signal is high;
   (d) output enable active low, wherein said output enable signal is provided when said enable signal is low; and
   (e) no connect, wherein said enable signal has no effect on said chip enable and output enable signals.

3. An enable buffer circuit having an input terminal for receiving an input enable signal, a first output terminal for providing a first output enable signal, and a second output terminal for providing a second output enable signal, comprising:
   first programmable output means having an output lead connected to said first output terminal, wherein said first programmable output means is capable of being programmed to either a first state, a second, or a third state, wherein in said first state said means provides on said output lead a first signal in response to said input enable signal, in said second state said means provides on said output lead a second signal in response to said input enable signal, and in said third state said means provides a third signal on said output lead;
   second programmable output means having an output lead connected to said second output terminal, wherein said second programmable output means is capable of being programmed to a first output state when said first programmable output means is programmed in said first or third state, a second output state when said first programmable output means is programmed to said second or third state, or a third output state, wherein in said first state said second programmable output means provides on said output lead a first output signal in response to said input enable signal, in said second state said second programmable output means provides on said output lead a second output signal in response to said input enable signal, and in said third output state said second programmable output means provides a third output signal on said output lead.

4. An enable buffer as in claim 3 wherein said first and second programmable output means are constructed using complementary metal oxide semiconductor field effect transistors.

5. An enable buffer as in claim 4 wherein said first and second programmable output means are programmed by altering selected transistors to remain on and other selected transistors to remain off.

6. An enable buffer circuit having an input terminal for receiving an input signal, a first output terminal, and a second output terminal, comprising:
   a first programmable inverter capable of being programmed to either a first state or a second state, having an input lead for receiving an input signal connected to said input terminal and an output lead wherein when said programmable inverter is programmed to said first state, said programmable inverter provides the inverse of said input signal on said output lead, and wherein, when said programmable inverter is programmed to said second state, said programmable inverter provides a fixed output signal on said output lead;

a first inverter having an input lead connected to said output lead of said first programmable inverter and having an output lead;

a first programmable element capable of being programmed to either a first state or a second state, having a first lead connected to said output lead of said first programmable inverter, and having a second lead, wherein when said first programmable element is programmed to said first state said first programmable element provides a low impedance path between said first and said second leads, and wherein, when said first programmable element is programmed to said second state, said first programmable element provides a high impedance path between said first and second leads;

a second programmable element capable of being programmed to either a first state or a second state, having a first lead connected to said output lead of said first inverter, and having a second lead connected to said second lead of said first programable element, wherein, when said second programmable element is programmed to said first state, said second programmable element provides a low impedance path between said first and said second leads, and wherein, when said second programmable element is programmed to said second state, said second programmable element provides a high impedance path between said first and said second leads;

a second programmable inverter capable of being programmed to either of a first state or a second state, having an input lead for receiving an input signal connected to said second lead of said second programmable element and an output lead connected to said first output terminal, wherein when said second programmable inverter is programmed to said first state, said second programmable inverter provides the inverse of said input signal on said output lead, and wherein, when said second programmable inverter is programmed to said second state, said second programmable inverter provides a fixed output signal on said output lead; and a third programmable inverter capable of being programmed to either of a first state or a second state, having an input lead for receiving an input signal connected to said second lead of said first programmable element and an output lead connected to said second output terminal, wherein, when said third programmable inverter is programmed to said first state, said third programmable inverter provides the inverse of said input signal on said output lead, and wherein, when said third programmable inverter is programmed to said second state, said third programmable inverter provides a fixed output signal on said output lead.

* * * * *